(12) United States Patent
Wang et al.

(10) Patent No.: US 8,400,186 B1
(45) Date of Patent: Mar. 19, 2013

(54) TECHNIQUES FOR BUFFERING SINGLE-ENDED AND DIFFERENTIAL SIGNALS

(75) Inventors: Xiaobao Wang, Cupertino, CA (US); Chiakang Sung, Milpitas, CA (US); Joseph Huang, Morgan Hill, CA (US); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/401,562

(22) Filed: Feb. 21, 2012

(51) Int. Cl.
*H03K 19/094* (2006.01)

(52) U.S. Cl. .......................................... 326/83; 326/38

(58) Field of Classification Search .................... 326/37, 326/38, 82, 83
See application file for complete search history.

(56) References Cited

U.S. PATENT DOCUMENTS

| | | | |
|---|---|---|---|
| 6,683,484 B1 | 1/2004 | Kueng et al. | |
| 7,109,744 B1 * | 9/2006 | Shumarayev et al. | 326/30 |
| 7,145,359 B2 * | 12/2006 | Hein et al. | 326/38 |
| 7,218,147 B2 | 5/2007 | Chauhan et al. | |
| 7,551,014 B1 * | 6/2009 | Wang et al. | 327/256 |
| 7,724,026 B1 | 5/2010 | Tan | |
| 2002/0003436 A1 * | 1/2002 | Andrews et al. | 326/40 |
| 2004/0160242 A1 | 8/2004 | Rahman | |
| 2005/0212553 A1 * | 9/2005 | Best et al. | 326/30 |
| 2005/0285629 A1 * | 12/2005 | Hein et al. | 326/115 |
| 2008/0068064 A1 | 3/2008 | Wong | |
| 2011/0316590 A1 * | 12/2011 | Chang et al. | 327/108 |

* cited by examiner

*Primary Examiner* — Don Le
(74) *Attorney, Agent, or Firm* — Steven J. Cahill

(57) ABSTRACT

A circuit comprises first and second differential pairs and first and second switch circuits. The first differential pair includes first and second transistors operable to generate a first output signal based on a first input signal in a single-ended mode. The second differential pair includes third and fourth transistors operable to generate a second output signal based on a second input signal in the single-ended mode. The first switch circuit is operable to block current through the second transistor in a differential mode. The second switch circuit is operable to block current through the third transistor in the differential mode. The first and the fourth transistors are operable to generate a third output signal based on a third input signal in the differential mode.

20 Claims, 7 Drawing Sheets

US 8,400,186 B1

TECHNIQUES FOR BUFFERING SINGLE-ENDED AND DIFFERENTIAL SIGNALS

TECHNICAL FIELD

The present disclosure relates to electronic circuits, and more particularly, to techniques for buffering single-ended and differential signals.

BACKGROUND

The Stratix® V field programmable gate array (FPGA) circuit manufactured by Altera Corporation of San Jose, Calif., includes a memory interface. The memory interface is designed to receive data signals (DQ) and a strobe signal (DQS) from a memory integrated circuit. The memory interface provides the data signals and strobe signal to the core circuitry of the FPGA.

Each of two input pins in the memory interface of the FPGA can be used to receive one single-ended data signal (DQ) or to receive one of two signals that embody a differential strobe signal (DQS). The memory interface includes two single-ended input buffers and a differential input buffer that are compliant with the SSTL (Stub Series Terminated Logic) and HSTL (High-Speed Transceiver Logic) standards.

The first input pin in the memory interface is coupled to an input of the first single-ended input buffer and to a first input of the differential input buffer. The second input pin in the memory interface is coupled to an input of the second single-ended input buffer and to a second input of the differential input buffer. If the input pins in the memory interface receive two single-ended data signals, the single-ended input buffers buffer the single-ended data signals. If the input pins in the memory interface receive a differential strobe signal, the differential input buffer buffers the differential strobe signal.

BRIEF SUMMARY

According to some embodiments, a circuit comprises first and second differential pairs and first and second switch circuits. The first differential pair includes first and second transistors that are operable to generate a first output signal based on a first input signal in a single-ended mode. The second differential pair includes third and fourth transistors that are operable to generate a second output signal based on a second input signal in the single-ended mode. The first switch circuit is operable to block current through the second transistor in a differential mode. The second switch circuit is operable to block current through the third transistor in the differential mode. The first and the fourth transistors are operable to generate a third output signal based on a third input signal in the differential mode.

Various objects, features, and advantages of the present invention will become apparent upon consideration of the following detailed description and the accompanying drawings.

DETAILED DESCRIPTION

Figure 1:
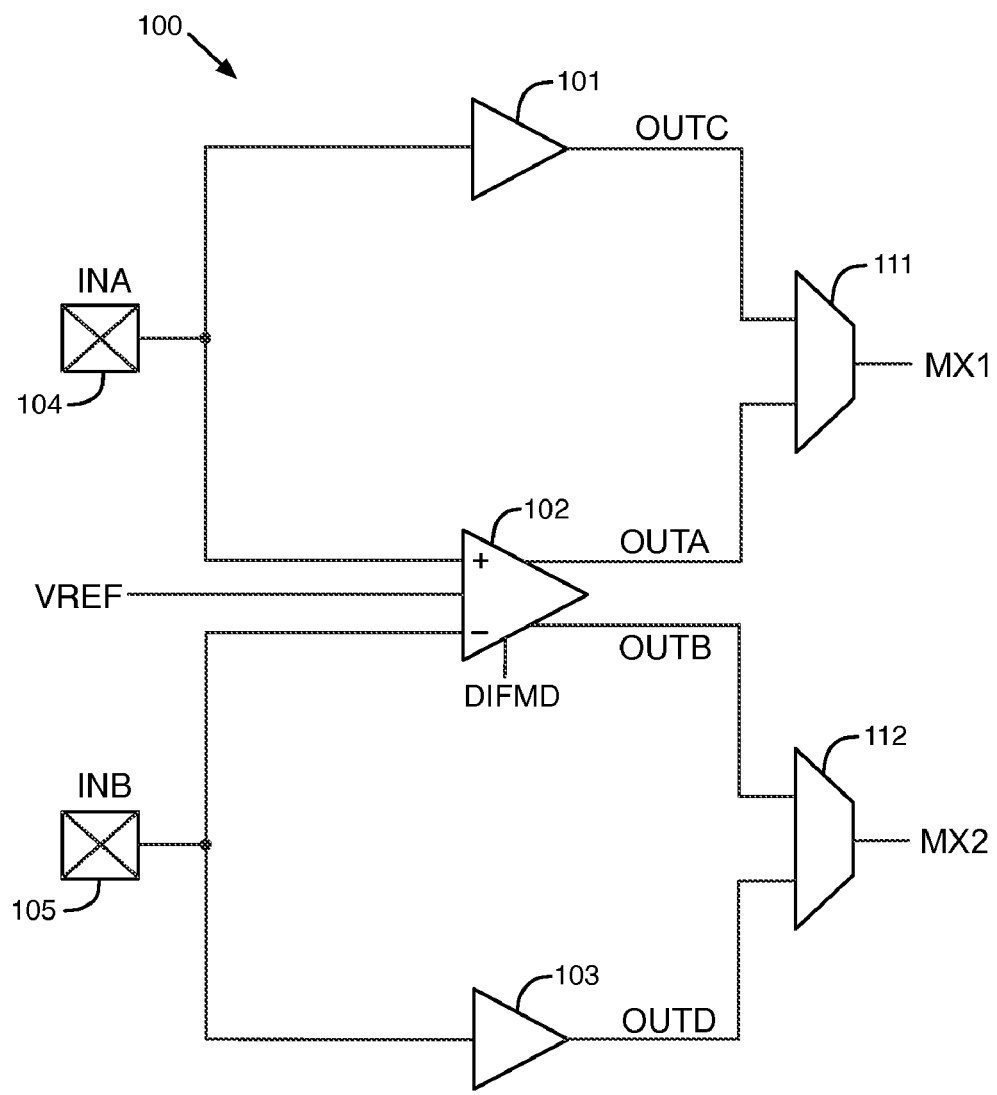
FIG. 1 illustrates an example of an interface circuit, according to an embodiment of the present invention.

FIG. 1 illustrates an example of an interface circuit 100, according to an embodiment of the present invention. Interface circuit 100 may be, for example, a memory interface for buffering single-ended data signals or a differential strobe signal. Alternatively, interface circuit 100 may be another type of interface circuit for buffering other types of signals. Interface circuit 100 is typically in an integrated circuit, such as a field programmable gate array (FPGA) integrated circuit.

Interface circuit 100 includes single-ended input buffer circuits 101 and 103 and pins 104-105. Interface circuit 100 also includes input buffer circuit 102 and multiplexer circuits 111-112. Input buffer circuit 102 is configurable to operate in a single-ended mode or in a differential mode. Pins 104-105 are external terminals of the integrated circuit that includes interface circuit 100. Pin 104 is coupled to the input of input buffer circuit 101 and to the non-inverting input of input buffer circuit 102. Pin 105 is coupled to the input of input buffer circuit 103 and to the inverting input of input buffer circuit 102.

As shown in FIG. 1, input signals INA and INB are applied to pins 104 and 105, respectively. Input signals INA and INB are varying voltage signals. A constant reference voltage signal VREF is provided to a third input of input buffer circuit 102. A digital mode control signal DIFMD is provided to a fourth input of input buffer circuit 102. The mode control signal DIFMD controls when input buffer circuit 102 is operating in single-ended mode and when input buffer circuit 102 is operating in differential mode. When input signals INA and INB represent two single-ended signals, input buffer circuit 102 operates in single-ended mode. In single-ended mode, input buffer circuit 102 generates a single-ended output signal OUTA based on input signal INA and a single-ended output signal OUTB based on input signal INB. When the difference between input signals INA and INB represents a differential signal, input buffer circuit 102 operates in differential mode. In differential mode, input buffer circuit 102 generates one output signal OUTA based on both of input signals INA and INB.

In an exemplary implementation of FIG. 1 that is not intended to be limiting, input buffer circuit 102 is compliant with the SSTL, HSTL, and low voltage differential signaling (LVDS) standards, and single-ended buffer circuits 101 and 103 are compatible with the low-voltage CMOS (LVCMOS) and low-voltage transistor-transistor logic (LVTTL) input/output standards. According to this exemplary implementation of FIG. 1, input buffer circuit 102 buffers two single-ended data signals received at pins 104-105 in single-ended mode or a differential strobe signal received at pins 104-105 in differential mode when interface circuit 100 is used as a memory interface.

Input buffer circuits 101 and 103 buffer signals INA and INB to generate output signals OUTC and OUTD, respectively. Output signals OUTA and OUTC are provided to multiplexing inputs of multiplexer circuit 111. Output signals OUTB and OUTD are provided to multiplexing inputs of multiplexer circuit 112. If input buffer circuit 102 is compliant with the signaling standard of input signals INA and INB, multiplexer circuit 111 is configured to generate its output signal MX1 based on output signal OUTA, and multiplexer circuit 112 is configured to generate its output signal MX2 based on output signal OUTB. If input buffer circuits 101 and 103 are compliant with the signaling standard of input signals INA and INB, multiplexer circuit 111 is configured to generate its output signal MX1 based on output signal OUTC, and multiplexer circuit 112 is configured to generate its output signal MX2 based on output signal OUTD.

In some embodiments, input buffer circuit 102 provides a lower input capacitance at pins 104 and 105 relative to an interface that has separate single-ended and differential SSTL/HSTL input buffers coupled to each pair of input pins in the interface. In some embodiments, input buffer circuit 102 also uses less integrated circuit die area than the combined die area used by separate single-ended and differential SSTL/HSTL input buffers.

Figure 2:
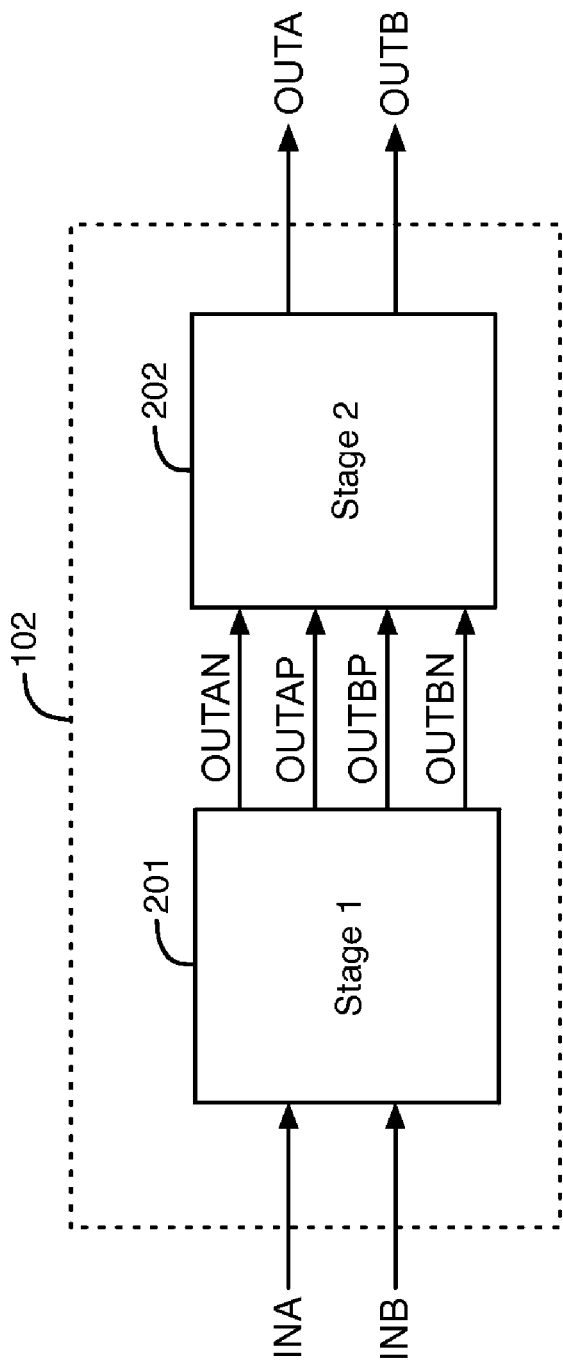
FIG. 2 illustrates an example of an input buffer circuit having two stages that can be used in the interface circuit of FIG. 1, according to an embodiment of the present invention.

FIG. 2 illustrates an example of input buffer circuit 102 having two stages, according to an embodiment of the present invention. Input buffer circuit 102 includes stage 1 circuit 201 and stage 2 circuit 202. Input signals INA and INB are provided from pins 104-105, respectively, to inputs of stage 1 circuit 201.

When input buffer circuit 102 is in single-ended mode, stage 1 circuit 201 generates output signals OUTAN and OUTAP based on input signal INA and output signals OUTBP and OUTBN based on input signal INB. Signals OUTAN, OUTAP, OUTBP, and OUTBN are provided to inputs of stage 2 circuit 202. When input buffer circuit 102 is in single-ended mode, stage 2 circuit 202 generates single-ended output signal OUTA based on signals OUTAN and OUTAP, and stage 2 circuit 202 generates single-ended output signal OUTB based on signals OUTBP and OUTBN.

When input buffer circuit 102 is in differential mode, stage 1 circuit 201 generates output signals OUTAN and OUTBN based on the difference in the voltage between input signals INA and INB, and stage 2 circuit 202 generates only one output signal OUTA based on the difference in the voltage between signals OUTAN and OUTBN.

Figure 3:
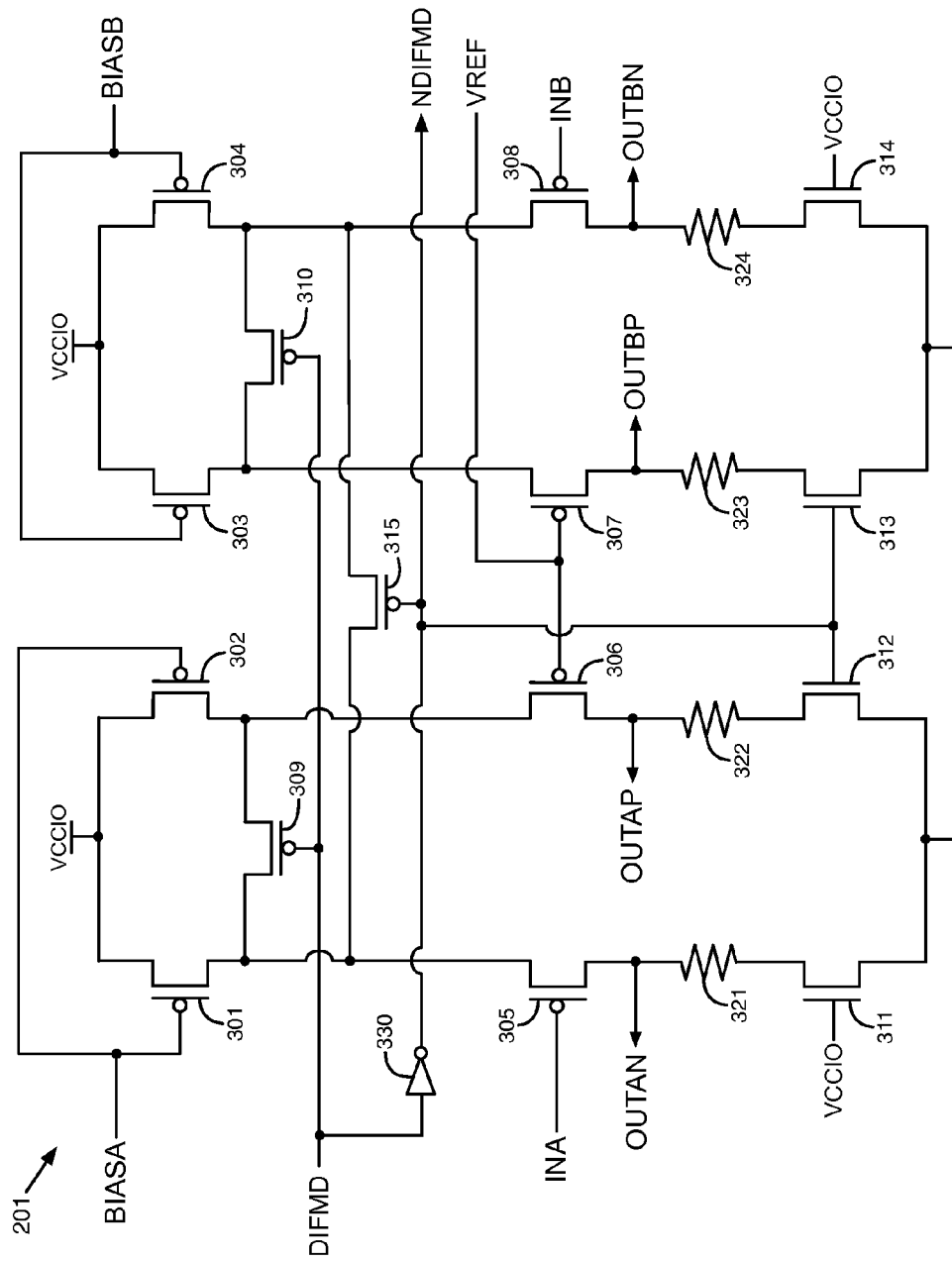
FIG. 3 illustrates an example of the stage 1 circuit shown in FIG. 2, according to an embodiment of the present invention.

FIG. 3 illustrates an example of stage 1 circuit 201, according to an embodiment of the present invention. Stage 1 circuit 201 includes p-channel metal oxide semiconductor field-effect transistors (MOSFETs) 301-310 and 315, n-channel MOSFETs 311-314, passive resistors 321-324, and CMOS inverter circuit 330. A supply voltage VCCIO is provided to the sources of p-channel transistors 301-304 and to the gates of n-channel transistors 311 and 314. The sources of n-channel transistors 311-314 are coupled to a node at a ground voltage.

Input voltage INA is provided to a gate of p-channel transistor 305, and input voltage INB is provided to a gate of p-channel transistor 308. The constant reference voltage VREF is provided to the gates of p-channel transistors 306-307. Mode control signal DIFMD is provided to the gates of p-channel transistors 309-310 and to an input of inverter circuit 330. Inverter circuit 330 inverts the logic state of the mode control signal DIFMD to generate an inverted mode control signal NDIFMD. Signal NDIFMD is provided to the gates of n-channel transistors 312-313 and p-channel transistor 315.

A first bias voltage BIASA is provided to the gates of p-channel transistors 301-302, and a second bias voltage BIASB is provided to the gates of p-channel transistors 303-304. Bias voltages BIASA and BIASB are selected to be constant voltages that cause transistors 301-304 to function in their saturation regions when stage 1 circuit 201 is enabled. Bias voltages BIASA and BIASB can be pulled to supply voltage VCCIO to disable stage 1 circuit 201.

In order to cause input buffer circuit 102 to function in single-ended mode, mode control signal DIFMD is driven to a logic low state (e.g., at the ground voltage). When mode control signal DIFMD is in a logic low state, p-channel transistors 309-310 are on. In response to mode control signal DIFMD being in a logic low state, inverter circuit 330 causes signal NDIFMD to be in a logic high state (e.g., at supply voltage VCCIO). When signal NDIFMD is in a logic high state, n-channel transistors 312-313 are on, and p-channel transistor 315 is off. Transistor 315 is a switch circuit that is off (i.e., in a non-conductive open state) in single-ended mode.

Transistors 309-310 and 312-313 are switch circuits that are on (i.e., in closed conductive states) in single-ended mode. Transistors 311 and 314 are provided for matching transistors 312 and 313, respectively. When transistor 309 is on, transistors 301-302 and 309 function as a first constant current source. When transistor 310 is on, transistors 303-304 and 310 function as a second constant current source. Resistors 321-324 are load resistors. In an alternative embodiment, passive resistors 321-324 can be replaced with transistors that function as resistive load circuits. In an embodiment, VREF is selected to be the common mode voltage of input signals INA and INB.

In single-ended mode, resistors 321-322 and transistors 301-302, 305-306, 309, and 311-312 function as a first comparator, and transistors 305-306 function as a differential pair of transistors in the first comparator. As the conductive state of transistor 305 varies in response to changes in the voltage of signal INA, the current provided by transistors 301-302 and 309 is steered in varying proportions through one or both of transistors 305-306. The current through transistor 305 flows through resistor 321 and transistor 311 to ground. The current through transistor 306 flows through resistor 322 and transistor 312 to ground.

The first comparator compares the varying single-ended voltage signal INA to reference voltage VREF to generate output signals OUTAN and OUTAP at the drains of transistors 305-306, respectively, in single-ended mode. When the voltage of signal INA is greater than reference voltage VREF, the first comparator causes the voltage of signal OUTAP to be greater than the voltage of signal OUTAN. When the voltage of signal INA is less than the reference voltage VREF, the first comparator causes the voltage of signal OUTAN to be greater than the voltage of signal OUTAP. The difference between output signals OUTAN and OUTAP represents a differential signal in the single-ended mode.

In single-ended mode, resistors 323-324 and transistors 303-304, 307-308, 310, 313-314 function as a second comparator, and transistors 307-308 function as a differential pair of transistors in the second comparator. As the conductive state of transistor 308 varies in response to changes in the voltage of signal INB, the current provided by transistors 303-304 and 310 is steered in varying proportions through one or both of transistors 307-308. The current through transistor 307 flows through resistor 323 and transistor 313 to ground. The current through transistor 308 flows through resistor 324 and transistor 314 to ground.

The second comparator compares varying single-ended voltage signal INB to reference voltage VREF to generate output signals OUTBP and OUTBN at the drains of transistors 307-308, respectively, in single-ended mode. When the voltage of signal INB is greater than reference voltage VREF, the second comparator causes the voltage of signal OUTBP to be greater than the voltage of signal OUTBN. When the voltage of signal INB is less than reference voltage VREF, the second comparator causes the voltage of signal OUTBN to be greater than the voltage of signal OUTBP. The difference between signals OUTBP and OUTBN represents a differential signal in the single-ended mode. The first and second comparators function independently in the single-ended mode.

In order to cause input buffer circuit 102 to function in differential mode, mode control signal DIFMD is driven to a logic high state (e.g., at supply voltage VCCIO). When mode control signal DIFMD is in a logic high state, p-channel transistors 309-310 are off (i.e., open and non-conductive), and inverter circuit 330 causes signal NDIFMD to be in a logic low state (e.g., at ground). When signal NDIFMD is in a logic low state, n-channel transistors 312-313 are off (i.e., open and non-conductive), and p-channel transistor 315 is on (i.e., closed and conductive) in differential mode.

When transistors 309-310 and 312-313 are off, and transistor 315 is on, transistors 301, 304, and 315 function as a constant current source. When transistor 312 is off in differential mode, transistor 312 blocks current through transistor 306. When transistor 313 is off in differential mode, transistor 313 blocks current through transistor 307. In differential mode, transistors 301, 304, 305, 308, 311, 314, 315, resistor 321, and resistor 324 function as a differential buffer circuit, and transistors 305 and 308 function as a differential pair of transistors in the differential buffer circuit. In differential mode, transistors 301, 304, and 315 provide current through the differential pair of transistors 305 and 308. In differential mode, the voltage difference between input signals INA and INB represents a varying differential voltage signal. As the conductive states of transistors 305 and 308 vary based on changes in the difference between the voltages of input signals INA and INB, the current provided by transistors 301, 304, and 315 is steered in varying proportions through one or both of transistors 305 and 308.

The differential buffer circuit buffers the varying differential voltage signal indicated by signals INA and INB to generate varying voltage output signals OUTAN and OUTBN at the drains of transistors 305 and 308, respectively, in differential mode. When the voltage of signal INA is greater than the voltage of signal INB, the differential buffer circuit causes the voltage of signal OUTBN to be greater than the voltage of signal OUTAN. When the voltage of signal INB is greater than the voltage of signal INA, the differential buffer circuit causes the voltage of signal OUTAN to be greater than the voltage of signal OUTBN. The voltage difference between output signals OUTAN and OUTBN represents a differential voltage signal in differential mode.

Figure 4:
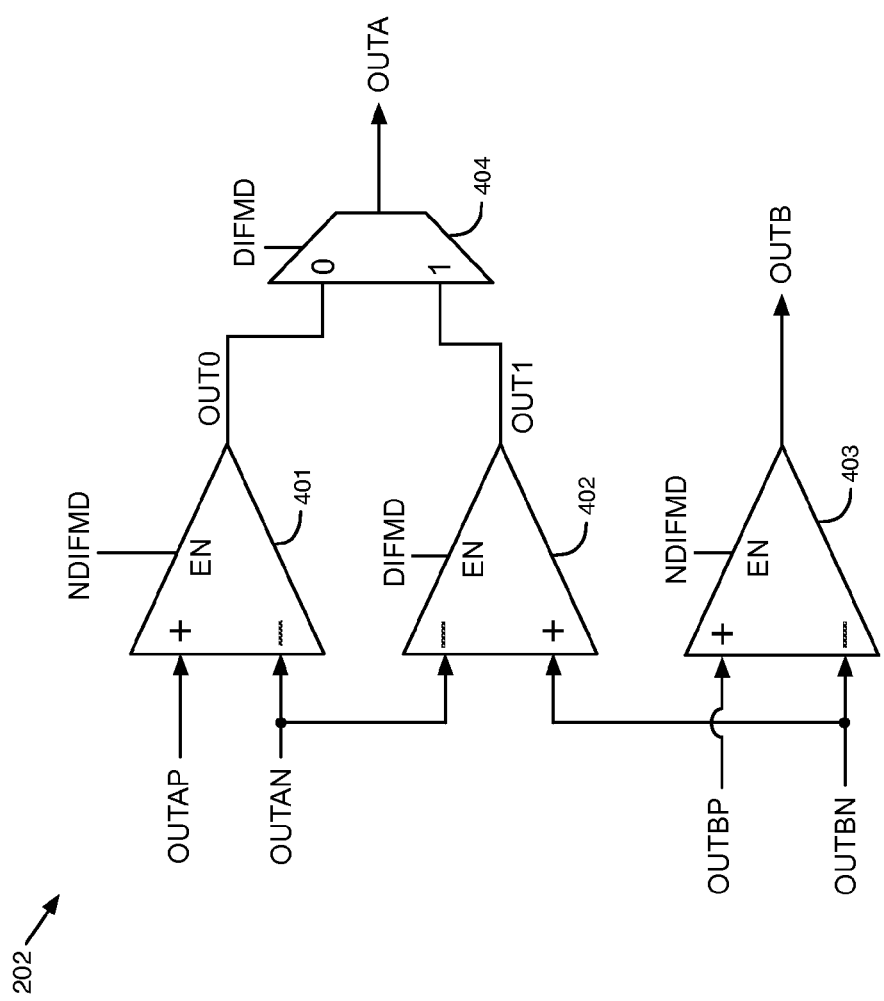
FIG. 4 illustrates an example of the stage 2 circuit shown in FIG. 2, according to an embodiment of the present invention.

FIG. 4 illustrates an example of stage 2 circuit 202, according to an embodiment of the present invention. Stage 2 circuit 202 includes amplifier circuits 401-403 and multiplexer circuit 404. Signals OUTAP and OUTAN are provided from stage 1 circuit 201 to the non-inverting and inverting inputs, respectively, of amplifier circuit 401. Signals OUTBP and OUTBN are provided from stage 1 circuit 201 to the non-inverting and inverting inputs, respectively, of amplifier circuit 403. Signals OUTAN and OUTBN are provided to the inverting and non-inverting inputs, respectively, of amplifier circuit 402. The outputs of amplifier circuits 401 and 402 are coupled to the 0 and 1 multiplexing inputs, respectively, of multiplexer circuit 404.

Mode control signal DIFMD is provided to an enable input EN of amplifier circuit 402 and to a select input of multiplexer circuit 404. Inverted mode control signal NDIFMD is provided from stage 1 circuit 201 to the enable inputs EN of amplifier circuits 401 and 403.

In single-ended mode, mode control signal DIFMD is in a logic low state, causing amplifier circuit 402 to be disabled. Also in single-ended mode, inverted mode control signal NDIFMD is in a logic high state, causing amplifier circuits 401 and 403 to be enabled. When amplifier circuit 401 is enabled in single-ended mode, amplifier circuit 401 amplifies the voltage difference between signals OUTAP and OUTAN to generate an amplified output voltage signal OUT0 at the 0 multiplexing input of multiplexer circuit 404. In response to control signal DIFMD being in a logic low state, multiplexer circuit 404 selects amplified output voltage signal OUT0 at its 0 multiplexing input and generates amplified output voltage signal OUTA based on output signal OUT0. When amplifier circuit 403 is enabled in single-ended mode, amplifier circuit 403 amplifies the voltage difference between signals OUTBP and OUTBN to generate an amplified output voltage signal OUTB. Output signals OUTA and OUTB are independent single-ended voltage signals in single-ended mode.

In differential mode, mode control signal DIFMD is in a logic high state, causing amplifier circuit 402 to be enabled. Also in differential mode, inverted mode control signal NDIFMD is in a logic low state, causing amplifier circuits 401 and 403 to be disabled. When amplifier circuit 402 is enabled in differential mode, amplifier circuit 402 amplifies the voltage difference between signals OUTBN and OUTAN to generate an amplified output voltage signal OUT1 at the 1 multiplexing input of multiplexer circuit 404. In response to control signal DIFMD being in a logic high state, multiplexer circuit 404 selects amplified output voltage signal OUT1 at its 1 multiplexing input and generates amplified output voltage signal OUTA based on output signal OUT1. When amplifier circuits 401 and 403 are disabled in differential mode, amplifier circuits 401 and 403 do not generate varying output signals.

Figure 5:
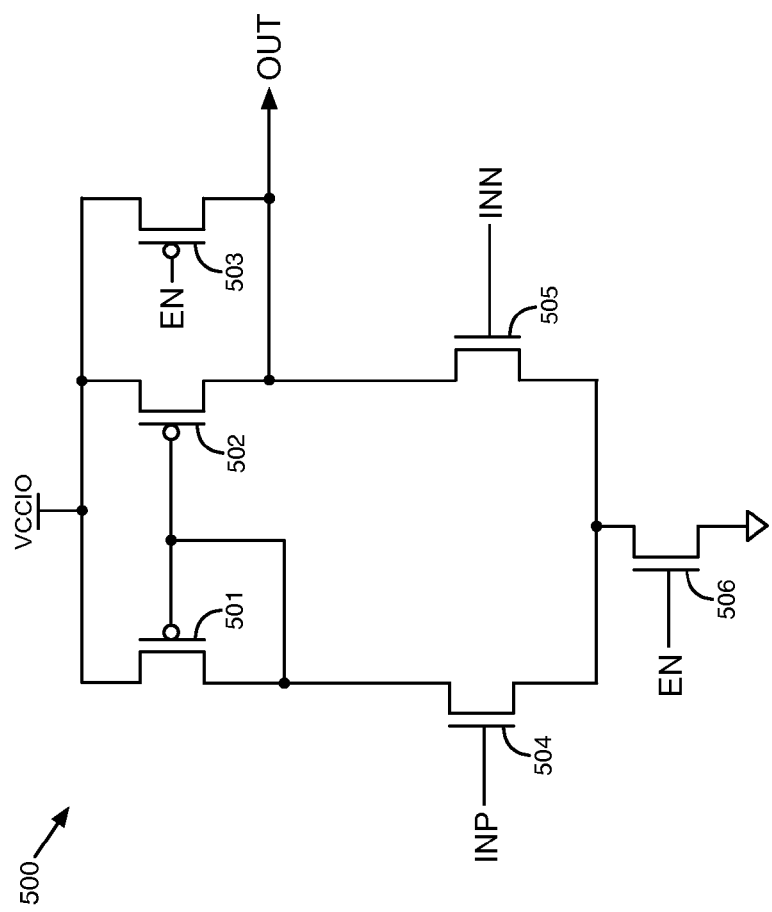
FIG. 5 illustrates an amplifier circuit, according to an embodiment of the present invention.

FIG. 5 illustrates an amplifier circuit 500, according to an embodiment of the present invention. Amplifier circuit 500 is an example of the circuitry in each of the three amplifier circuits 401-403 in stage 2 circuit 202. According to some embodiments, each of the three amplifier circuits 401-403 includes an instance of amplifier circuit 500.

Amplifier circuit 500 includes p-channel MOSFETs 501-503 and n-channel MOSFETs 504-506. Input signals INP and INN are provided to the gates of n-channel transistors 504 and 505, respectively. Transistors 504-505 are a differential pair of transistors. Transistors 501-502 are load transistors for the differential pair. Enable signal EN is provided to the gates of transistors 503 and 506. The sources of transistors 501-503 are coupled to a node at supply voltage VCCIO, and the source of transistor 506 is coupled to a node at a ground voltage.

The voltage difference between input signals INP and INN is a differential voltage signal. When the enable signal EN is in a logic high state, transistor 506 is on, transistor 503 is off, and amplifier circuit 500 is enabled. When amplifier circuit 500 is enabled, amplifier circuit 500 amplifies the voltage difference between input signals INP and INN to generate a single-ended amplified output voltage signal OUT at the drains of transistors 502 and 505. Transistors 503 and 506 function as switch circuits in amplifier circuit 500. When the enable signal EN is in a logic low state, transistor 506 is off, amplifier circuit 500 is disabled, and transistor 503 pulls the voltage of output signal OUT to supply voltage VCCIO. Transistor 503 keeps output signal OUT at VCCIO when amplifier circuit 500 is disabled in order to reduce power consumption in multiplexer circuits 404 and 112.

In amplifier circuit 401, input signals INP and INN in FIG. 5 are signals OUTAP and OUTAN, respectively, and enable signal EN in FIG. 5 is control signal NDIFMD. In amplifier circuit 402, input signals INP and INN in FIG. 5 are signals OUTBN and OUTAN, respectively, and enable signal EN in FIG. 5 is control signal DIFMD. In amplifier circuit 403, input signals INP and INN in FIG. 5 are signals OUTBP and OUTBN, respectively, and enable signal EN in FIG. 5 is control signal NDIFMD.

Figure 6:
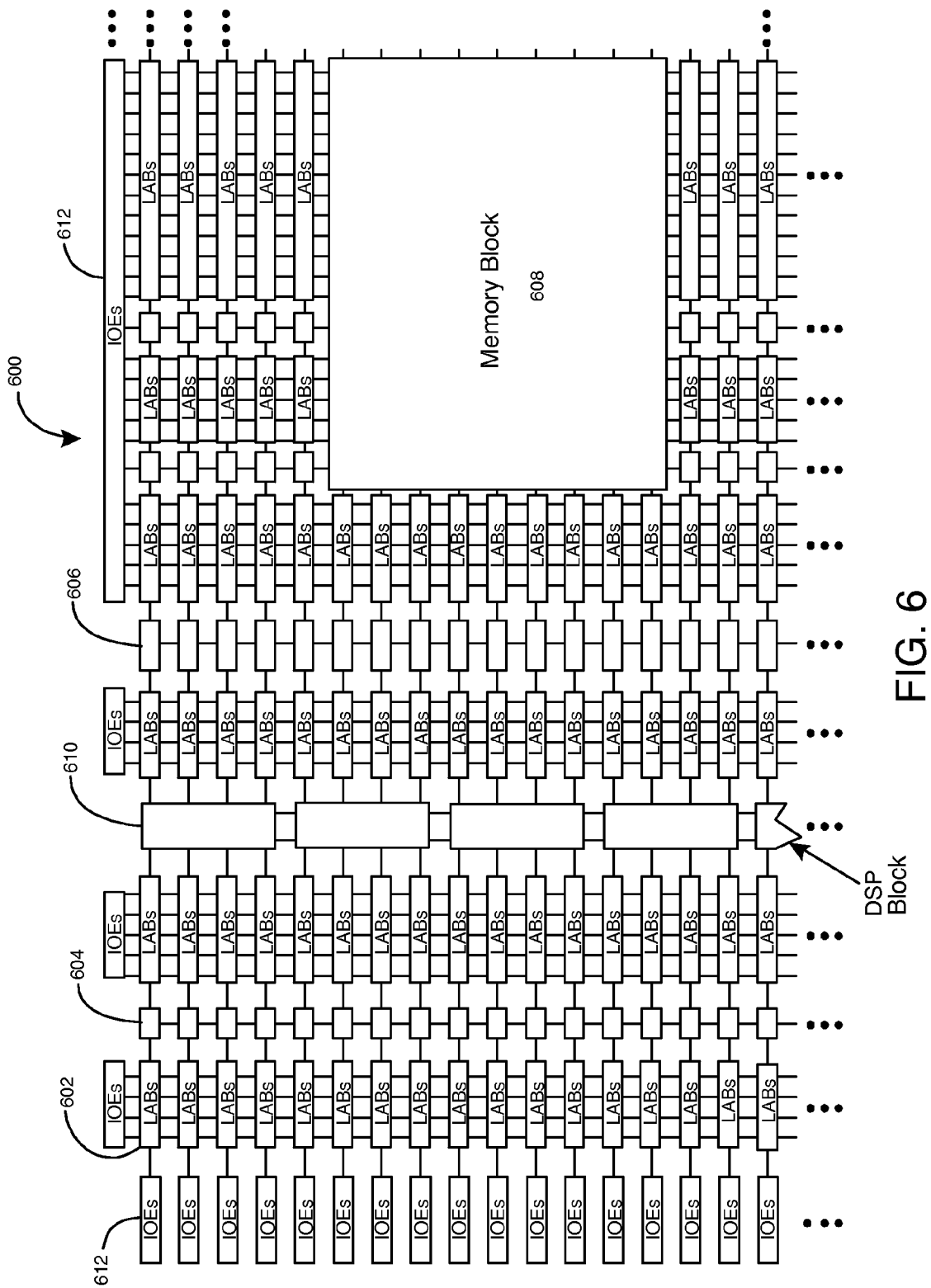
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) blocks 610 that can implement, for example, multipliers with add or subtract features. Input/output elements (IOEs) 612 support numerous single-ended and differential input/output standards. IOEs 612 include input and output buffers that are coupled to pins of the integrated circuit. One or more of IOEs 612 may include an interface circuit 100 as shown in FIG. 1. The output signals MX1 and MX2 of interface circuit 100 may be provided to LABs 602 or to other circuitry in the IOE. The pins are external terminals of the FPGA die that can be used to route, for example, input signals, output signals, and supply voltages between the FPGA and one or more external devices. FPGA 600 is described herein for illustrative purposes. Embodiments of the present invention can be implemented in many different types of integrated circuits.

Figure 7:
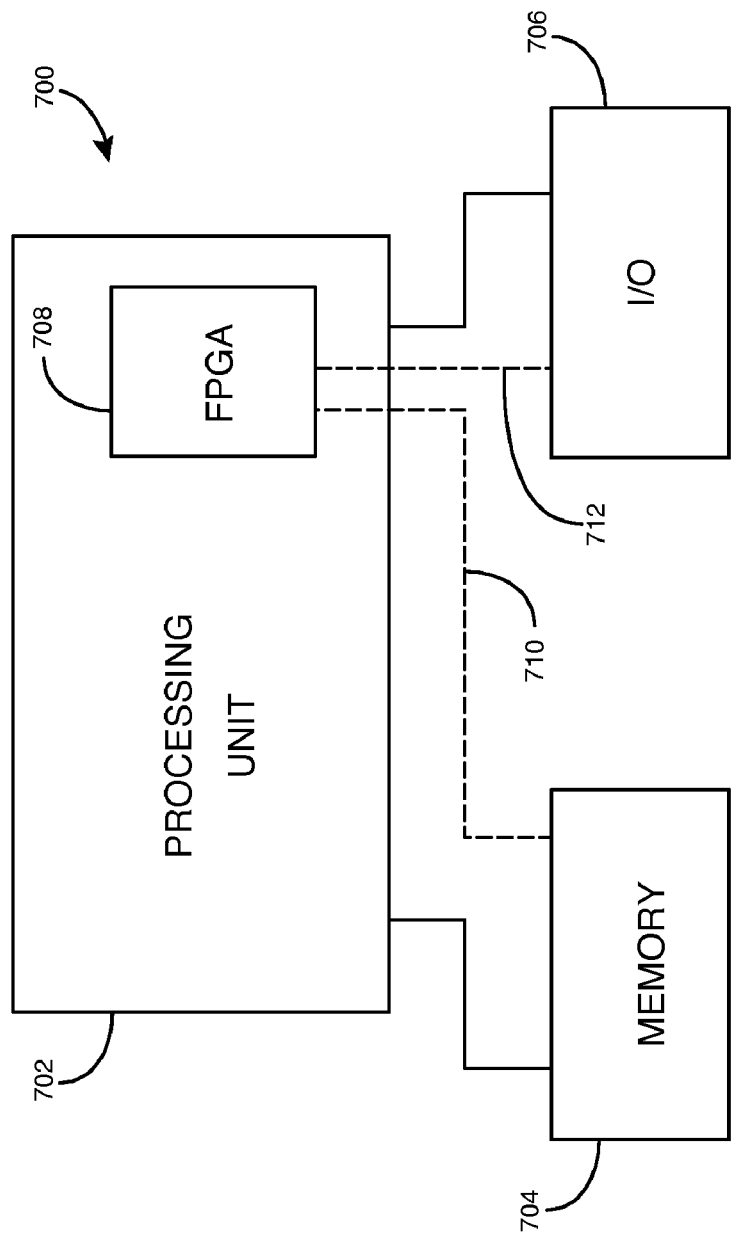
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
    a first differential pair of first and second transistors operable to generate a first output signal based on a first input signal in a single-ended mode;
    a second differential pair of third and fourth transistors operable to generate a second output signal based on a second input signal in the single-ended mode;
    a first switch circuit operable to block current through the second transistor in a differential mode; and
    a second switch circuit operable to block current through the third transistor in the differential mode, wherein the first and the fourth transistors are operable to generate a third output signal based on a third input signal in the differential mode.

2. The circuit of claim 1, further comprising:
    a third switch circuit coupled between the first transistor and the fourth transistor, wherein the third switch circuit is on in the differential mode and off in the single-ended mode.

3. The circuit of claim 2, further comprising:
    a first current source circuit coupled to the first differential pair;

wherein the first current source circuit comprises a fourth switch circuit coupled between the first and the second transistors, and wherein the fourth switch circuit is off in the differential mode and on in the single-ended mode.

4. The circuit of claim 3, further comprising:
a second current source circuit coupled to the second differential pair,
wherein the second current source circuit comprises a fifth switch circuit coupled between the third and the fourth transistors, and wherein the fifth switch circuit is off in the differential mode and on in the single-ended mode.

5. The circuit of claim 4, wherein the third switch circuit, a fifth transistor in the first current source circuit, and a sixth transistor in the second current source circuit are operable to provide current to the first and the fourth transistors in the differential mode, and the first and the fourth transistors are a third differential pair in the differential mode.

6. The circuit of claim 1, further comprising:
a first resistive circuit coupled between the first switch circuit and the second transistor; and
a second resistive circuit coupled between the second switch circuit and the third transistor.

7. The circuit of claim 6, further comprising:
a fifth transistor;
a third resistive circuit coupled between the first transistor and the fifth transistor;
a sixth transistor; and
a fourth resistive circuit coupled between the fourth transistor and the sixth transistor.

8. The circuit of claim 1, further comprising:
a first amplifier circuit operable to amplify the first output signal to generate a first amplified signal;
a second amplifier circuit operable to amplify the second output signal to generate a second amplified signal; and
a third amplifier circuit operable to amplify the third output signal to generate a third amplified signal.

9. The circuit of claim 8 further comprising:
a multiplexer circuit operable to generate a selected signal based on one of the first and the third amplified signals.

10. The circuit of claim 4, wherein the first switch circuit is a fifth transistor, the second switch circuit is a sixth transistor, the third switch circuit is a seventh transistor, the fourth switch circuit is an eighth transistor, the fifth switch circuit is a ninth transistor, and wherein conductive states of the first, the second, the third, the fourth, and the fifth switch circuits are controlled based on a control signal.

11. A circuit comprising:
a first differential pair of first and second transistors operable to generate a first output signal based on a first input signal in a single-ended mode;
a second differential pair of third and fourth transistors operable to generate a second output signal based on a second input signal in the single-ended mode; and
a first switch circuit coupled between the first transistor and the fourth transistor, wherein the first switch circuit is off in the single-ended mode and on in a differential mode, and wherein the first and the fourth transistors are operable to generate a third output signal based on a third input signal in the differential mode.

12. The circuit of claim 11, further comprising:
a second switch circuit operable to block current through the second transistor in the differential mode; and
a third switch circuit operable to block current through the third transistor in the differential mode.

13. The circuit of claim 12, further comprising:
a first resistive circuit coupled between the second switch circuit and the second transistor; and
a second resistive circuit coupled between the third switch circuit and the third transistor.

14. The circuit of claim 13, further comprising:
a fifth transistor;
a third resistive circuit coupled between the first transistor and the fifth transistor;
a sixth transistor; and
a fourth resistive circuit coupled between the fourth transistor and the sixth transistor.

15. The circuit of claim 11, further comprising:
a first current source circuit coupled to the first differential pair, wherein the first current source circuit comprises a second switch circuit coupled between the first and the second transistors, and wherein the second switch circuit is off in the differential mode and on in the single-ended mode; and
a second current source circuit coupled to the second differential pair, wherein the second current source circuit comprises a third switch circuit coupled between the third and the fourth transistors, and wherein the third switch circuit is off in the differential mode and on in the single-ended mode.

16. The circuit of claim 15, further comprising:
a first load circuit coupled to the first differential pair, wherein the first differential pair, the first load circuit, and the first current source circuit function as a first comparator in the single-ended mode; and
a second load circuit coupled to the second differential pair, wherein the second differential pair, the second load circuit, and the second current source circuit function as a second comparator in the single-ended mode, wherein the first and the fourth transistors function as a third differential pair in the differential mode.

17. A method comprising:
generating a first output signal based on a first input signal using a first differential pair of first and second transistors in a single-ended mode;
generating a second output signal based on a second input signal using a second differential pair of third and fourth transistors in the single-ended mode;
disabling current through the second transistor in a differential mode by turning off a first switch circuit;
disabling current through the third transistor in the differential mode by turning off a second switch circuit; and
generating a third output signal based on a third input signal using a third differential pair of the first and the fourth transistors in the differential mode.

18. The method of claim 17 further comprising:
turning on a third switch circuit coupled between the first transistor and the fourth transistor in the differential mode; and
turning off the third switch circuit in the single-ended mode.

19. The method of claim 18 further comprising:
providing current from a first current source circuit to the first differential pair in the single-ended mode, wherein the first current source circuit comprises a fourth switch circuit coupled between the first and the second transistors, and wherein the fourth switch circuit is on in the single-ended mode;
providing current from a second current source circuit to the second differential pair in the single-ended mode, wherein the second current source circuit comprises a fifth switch circuit coupled between the third and the fourth transistors, and wherein the fifth switch circuit is on in the single-ended mode;

turning off the fourth and the fifth switch circuits in the differential mode; and providing current to the third differential pair in the differential mode from the third switch circuit, a fifth transistor in the first current source circuit, and a sixth transistor in the second current source circuit.

20. The method of claim 17, wherein a first resistive circuit is coupled between the first switch circuit and the second transistor, wherein a second resistive circuit is coupled between the second switch circuit and the third transistor, a third resistive circuit is coupled between the first transistor and a fifth transistor, and a fourth resistive circuit is coupled between the fourth transistor and a sixth transistor.

* * * * *